(12) United States Patent
Nasr Azadani et al.

(10) Patent No.: US 12,501,590 B2
(45) Date of Patent: Dec. 16, 2025

(54) SYSTEMS AND METHODS FOR ADJUSTING PRESSURE IN IMMERSION-COOLED DATACENTERS

(71) Applicant: Microsoft Technology Licensing, LLC, Redmond, WA (US)

(72) Inventors: Ehsan Nasr Azadani, Sammamish, WA (US); Bharath Ramakrishnan, Bellevue, WA (US); Nicholas Andrew Keehn, Kirkland, WA (US); Husam Atallah Alissa, Redmond, WA (US); Ruslan Nagimov, Redmond, WA (US); Eric C. Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 378 days.

(21) Appl. No.: 17/953,834

(22) Filed: Sep. 27, 2022

(65) Prior Publication Data
US 2024/0107716 A1 Mar. 28, 2024

(51) Int. Cl.
*H05K 7/20* (2006.01)
*H01M 10/44* (2006.01)
(Continued)

(52) U.S. Cl.
CPC ........ *H05K 7/20836* (2013.01); *H01M 10/44* (2013.01); *H01M 10/613* (2015.04);
(Continued)

(58) Field of Classification Search
CPC ............... H05K 7/20836; H05K 7/203; H05K 7/20318; H05K 7/20327; H05K 7/20818;
(Continued)

(56) References Cited

U.S. PATENT DOCUMENTS 4,103,493 A * 8/1978 Schoenfelder .......... F03G 6/003
62/235.1
4,141,708 A * 2/1979 Lavigne, Jr. ............ F25B 1/053
62/505
(Continued)

FOREIGN PATENT DOCUMENTS

| CN | 109004293 A | 12/2018 |
|---|---|---|
| CN | 111864299 A | 10/2020 |

(Continued)

OTHER PUBLICATIONS

"International Search Report and Written Opinion", from International Patent Application No. PCT/US2023/028303, mailed Nov. 8, 2023, 4 pages.
(Continued)

*Primary Examiner* — Ljiljana V. Ciric
(74) *Attorney, Agent, or Firm* — Ray Quinney & Nebeker P.C.; Paul N. Taylor (57) ABSTRACT

A thermal management system includes a high-pressure (HP) container, a low-pressure (LP) container in fluid communication with the HP container and having a fluid pressure less than the HP container, and a two-phase working fluid partially in the HP container and partially in the LP container. The two-phase working fluid has a vapor phase and a liquid phase. A pump is configured to move the working fluid through the system, and a condenser is configured to condense the vapor phase of the working fluid into the liquid phase.

20 Claims, 5 Drawing Sheets (51) Int. Cl.
*H01M 10/613* (2014.01)
*H01M 10/63* (2014.01)
*H01M 10/6567* (2014.01)

(52) U.S. Cl.
CPC ....... *H01M 10/63* (2015.04); *H01M 10/6567* (2015.04); *H05K 7/203* (2013.01); *H05K 7/20318* (2013.01); *H05K 7/20327* (2013.01); *H05K 7/20818* (2013.01); *H01M 2220/10* (2013.01)

(58) Field of Classification Search
CPC .... H01M 10/44; H01M 10/613; H01M 10/63; H01M 10/6567; H01M 2220/10
See application file for complete search history.

(56) References Cited

U.S. PATENT DOCUMENTS

| | | | | |
|---|---|---|---|---|
| 4,483,154 A * | 11/1984 | Smeal | ........... | F25B 27/00 62/235.1 |
| 4,704,658 A * | 11/1987 | Yokouchi | ........... | H05K 7/203 361/698 |
| 5,262,013 A * | 11/1993 | Beal | ........... | B01D 3/42 568/918 |
| 8,014,150 B2 * | 9/2011 | Campbell | ........... | H05K 7/20809 165/185 |
| 8,206,557 B2 * | 6/2012 | Burke | ........... | B01D 5/0051 202/205 |
| 9,144,179 B2 * | 9/2015 | Shelnutt | ........... | H05K 7/20809 |
| 9,207,002 B2 * | 12/2015 | Campbell | ........... | F25B 43/003 |
| 9,328,964 B2 * | 5/2016 | Shelnutt | ........... | H05K 7/20318 |
| 9,335,802 B2 * | 5/2016 | Shelnutt | ........... | H05K 7/203 |
| 9,351,429 B2 * | 5/2016 | Shelnutt | ........... | H05K 7/203 |
| 9,464,854 B2 * | 10/2016 | Shelnutt | ........... | H05K 7/20236 |
| 9,773,526 B2 * | 9/2017 | Shelnutt | ........... | H05K 7/20772 |
| 9,844,166 B2 * | 12/2017 | Shelnutt | ........... | F28F 27/02 |
| 9,854,715 B2 * | 12/2017 | Shedd | ........... | F28D 15/0266 |
| 9,901,013 B2 * | 2/2018 | Shedd | ........... | F25B 41/00 |
| 9,921,622 B2 * | 3/2018 | Shelnutt | ........... | H05K 7/20818 |
| 10,143,113 B2 * | 11/2018 | Shelnutt | ........... | G06F 1/20 |
| 10,184,699 B2 * | 1/2019 | Shedd | ........... | F28F 13/02 |
| 10,888,024 B1 * | 1/2021 | Pichai | ........... | H05K 7/20827 |
| 11,094,977 B2 | 8/2021 | Gao | | |
| 11,130,073 B2 * | 9/2021 | Damren | ........... | B01D 5/0027 |
| 11,357,130 B2 * | 6/2022 | Manousakis | ........... | H05K 7/20818 |
| 11,729,948 B2 * | 8/2023 | Alissa | ........... | H05K 7/20836 361/679.53 |
| 11,751,361 B2 * | 9/2023 | Kulkarni | ........... | H05K 7/20809 361/679.47 |
| 11,965,846 B2 * | 4/2024 | Fitch | ........... | H05K 7/20818 |
| 11,985,800 B2 * | 5/2024 | Gregory | ........... | H05K 7/20436 |
| 12,004,329 B1 * | 6/2024 | Pichai | ........... | H05K 7/20818 |
| 12,146,696 B2 * | 11/2024 | Nomoto | ........... | G03F 7/70716 |
| 2008/0264076 A1 * | 10/2008 | Price | ........... | F25J 1/0052 62/96 |
| 2010/0009244 A1 * | 1/2010 | Murata | ........... | H01M 10/613 429/53 |
| 2010/0261242 A1 * | 10/2010 | Harvey | ........... | C12P 19/02 435/157 |
| 2014/0216711 A1 | 8/2014 | Shelnutt et al. | | |
| 2015/0013960 A1 * | 1/2015 | Best | ........... | H05K 7/20381 165/104.31 |
| 2015/0043165 A1 * | 2/2015 | Best | ........... | H05K 7/20281 361/699 |
| 2015/0049432 A1 * | 2/2015 | Best | ........... | G06F 1/206 165/104.31 |
| 2015/0233619 A1 * | 8/2015 | Shedd | ........... | F25B 41/20 62/62 |
| 2016/0014932 A1 * | 1/2016 | Best | ........... | G06F 1/20 361/679.53 |
| 2021/0083340 A1 | 3/2021 | Gao | | |
| 2022/0136715 A1 * | 5/2022 | Edström | ........... | F24F 3/1417 62/94 |
| 2022/0279674 A1 * | 9/2022 | Manousakis | ........... | H05K 7/20818 |
| 2022/0330452 A1 * | 10/2022 | Alissa | ........... | H05K 7/20327 |
| 2025/0178943 A1 * | 6/2025 | Garvey | ........... | B01D 1/0011 |

FOREIGN PATENT DOCUMENTS

| | | | |
|---|---|---|---|
| EP | 3706524 | 9/2020 | |
| EP | 3768053 | 1/2021 | |
| GB | 2086024 A * | 5/1982 | ............. F25B 1/053 |
| KR | 101342907 B1 | 1/2014 | |
| WO | 2022017443 A1 | 1/2022 | |
| WO | WO2022066249 | 3/2022 | |

OTHER PUBLICATIONS

"Product Specification—Lithium Ion Battery System for UPS—U6a4", Retrieved from: https://library.e.abb.com/public/c7ae48187c614410bffff944e6a64cbb/Product%20Specification_LIB_Battery_System_For_UPS_U6A4_UL_200811_Rev0.41_for%20end%20customer_stp.pdf, Retrieved Date: Feb. 7, 2022, 26 Pages.

Ramakrishnan, et al., "CPU Overclocking: A Performance Assessment of Air, Cold Plates, and Two-Phase Immersion Cooling", In Journal of IEEE Transactions on Components, Packaging and Manufacturing Technology, vol. 11, Issue 10, Oct. 2021, pp. 1703-1715.

Weynand, James, "Liquid Immersion Cooling for Modular and Edge Data Centers", Retrieved from: https://www.datacenterdynamics.com/en/opinions/liquid-immersion-cooling-modular-and-edge-data-centers/, Jan. 18, 2021, 7 Pages.

International Preliminary Report on Patentability received for PCT Application No. PCT/US23/028303, mailed on Apr. 10, 2025, 17 pages.

* cited by examiner

SYSTEMS AND METHODS FOR ADJUSTING PRESSURE IN IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management.

BRIEF SUMMARY

In some embodiments, a thermal management system includes a high-pressure (HP) container, a low-pressure (LP) container in fluid communication with the HP container and having a fluid pressure less than the HP container, and a two-phase working fluid partially in the HP container and partially in the LP container. The two-phase working fluid has a vapor phase and a liquid phase. A pump is configured to move the working fluid through the system, and a condenser is configured to condense the vapor phase of the working fluid into the liquid phase.

In some embodiments, a method of thermal management of electronic devices includes detecting a change in battery operation of a battery located in an LP container, changing a pressure differential between an LP container of the battery and an HP container of another heat-generating component based at least partially on the change in battery operation, and lowering a boiling temperature of a two-phase working fluid proximate the battery.

In some embodiments, a thermal management system includes a HP container, a LP container in fluid communication with the HP container and having a fluid pressure less than the HP container, and a two-phase working fluid partially in the HP container and partially in the LP container. The two-phase working fluid has a vapor phase and a liquid phase. A pump is configured to move the working fluid through the system, and a condenser is configured to condense the vapor phase of the working fluid into the liquid phase. A controller is in data communication with at least the pump and the condenser, and the controller is configured to change the pressure in the LP container with the pump or the condenser.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

The present disclosure relates generally to systems and methods for thermal management of electronic devices or other heat-generating components. In some embodiments, immersion cooling systems described herein allow for changes to be made to a fluid pressure in an immersion tank. The changes to the fluid pressure can alter the boiling temperature of the working fluid in the tank. For example, an immersion cooling system according to the present disclosure includes one or more pressure control devices to adjust the fluid pressure in the immersion tank and change the boiling temperature of the working fluid to change the temperature at which the heat-generating components are maintained.

Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid can be circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-compute application assigned to and/or executed on the computing devices or systems in the immersion cooling system requires a large amount of thermal management. A working fluid boiling absorbs heat to overcome the latent heat of boiling. The phase change from liquid to vapor, therefore, allows the working fluid to absorb a comparatively large amount of heat with a small or no associated increase in temperature. Further, the lower density allows the vapor to be removed from the immersion bath efficiently to exhaust the associated heat from the system.

The changes in ratio between the liquid phase and vapor phase of the working fluid changes the pressure in the immersion tank. In some embodiments, a condenser, heat exchanger, or other device for cooling the vapor working fluid cannot change state quickly enough to respond to changes in compute demand and/or heat-generation of the electronic components in the immersion tank. More specifically, the heat-generation by the electronic components in the immersion tank is based on electrical power consumption and compute load. Assignment of a computational task, and associate compute load of the server computers in the immersion tank, can change more rapidly than the thermal capacity of the condenser, heat-exchanger, or other device cooling the working fluid.

In an example, a step-increase in compute load produces a step-increase in vaporization rate of the working fluid by the heat-generating components, while a condenser tasked with condensing the vapor working fluid has a relatively prolonged reaction time before a steady-state is achieved. In the time between the heat-generating components vaporizing more working fluid and the condenser responding, the fluid pressure in the immersion tank may increase. In another example, a step-decrease in compute load produces a step-decrease in vaporization rate of the working fluid by the heat-generating components, while a condenser tasked with condensing the vapor working fluid has a relatively prolonged reaction time before a steady-state is achieved. In the time between the heat-generating components vaporizing more working fluid and the condenser responding, the fluid pressure in the immersion tank may decrease as the condenser continues condensing the vapor working fluid, despite the heat-generating components vaporizing less working fluid. Some embodiments of the present disclosure can proactively adjust the fluid pressure in the tank to alter the boiling temperature in anticipation of changes in IT load or power demands.

In some embodiments, a thermal management system includes an immersion tank with a two-phase working fluid positioned therein. The two-phase working fluid receives heat from heat-generating components immersed in the liquid working fluid, and the heat vaporizes the working fluid, changing the working fluid from a liquid phase to a vapor phase. The thermal management system includes a condenser, such as described herein, to condense the vapor working fluid back into the liquid phase. In some embodiments, the condenser is in fluid communication with the immersion tank by one or more conduits. In some embodiments, the condenser is positioned inside the immersion tank.

Figure 1:
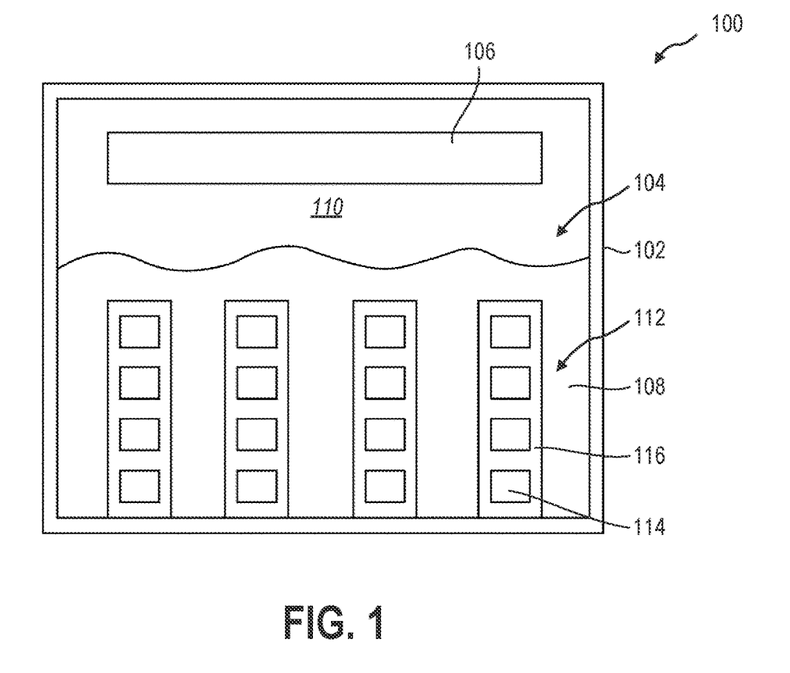
FIG. 1 is a side schematic representation of an immersion cooling system, according to at least one embodiment of the present disclosure.

A conventional immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
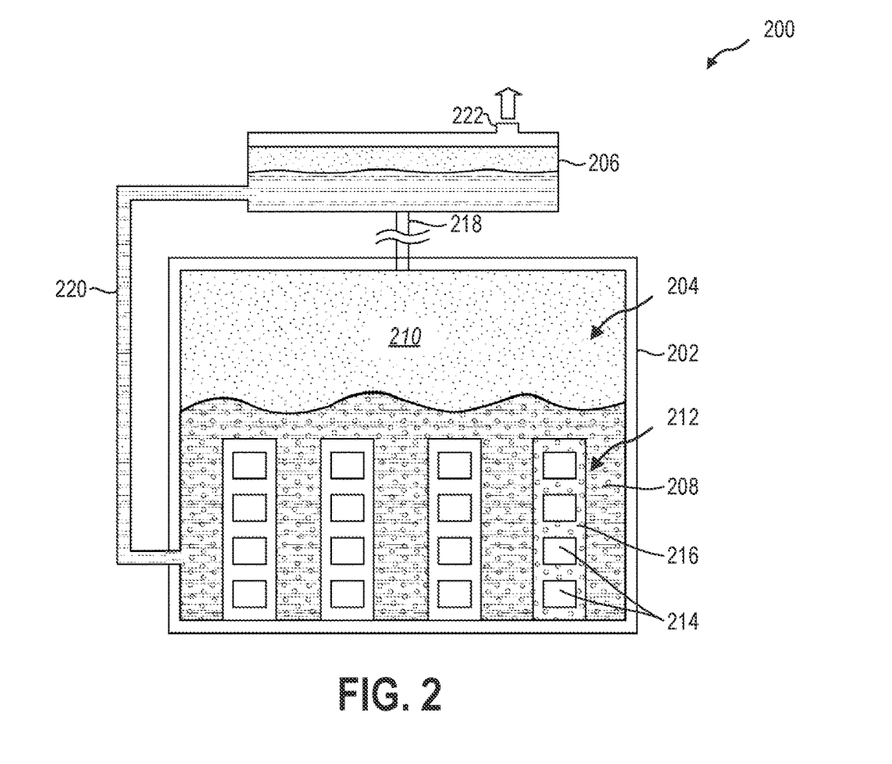
FIG. 2 is a side schematic representation of an immersion cooling system with an external condenser, according to at least one embodiment of the present disclosure.

Referring now to FIG. 2, in some embodiments, an immersion cooling system 200 includes an immersion tank 202 defining an immersion chamber 204 with an immersion working fluid positioned therein. An immersion working fluid in the immersion tank 202 has a boiling temperature that is at least partially related to one or more operating properties of the immersion cooling system, the electronic components and/or computing devices in the immersion tank 202, computational or workloads of the electronic components and/or computing devices in the immersion tank 202, external and/or environmental conditions, or other properties that affect the operation of the immersion cooling system 200. As the operating conditions of the immersion cooling system 200 change, the immersion cooling system 200 can change a mixing ratio of the immersion working fluid to change at least one property (such as boiling temperature) of the immersion working fluid.

In some embodiments, the immersion working fluid transitions between a liquid working fluid 208 phase and a vapor working fluid 210 phase to remove heat from hot or heat-generating components 214 in the immersion chamber 204. The liquid working fluid 208 more efficiency receives heat from the heat-generating components 214 and, upon transition to the vapor working fluid 210, the vapor working fluid 210 can be removed from the immersion tank 202, cooled and condensed by the condenser 206 (or other heat exchanger) to extract the heat from the working fluid, and the liquid working fluid 208 can be returned to the liquid immersion bath 212.

In some embodiments, the immersion bath 212 of the liquid working fluid 208 has a plurality of heat-generating components 214 positioned in the liquid working fluid 208. The liquid working fluid 208 surrounds at least a portion of the heat-generating components 214 and other objects or parts attached to the heat-generating components 214. In some embodiments, the heat-generating components 214 are positioned in the liquid working fluid 208 on one or more supports 216. The support 216 may support one or more heat-generating components 214 in the liquid working fluid 208 and allow the working fluid to move around the heat-generating components 214. In some embodiments, the support 216 is thermally conductive to conduct heat from the heat-generating components 214. The support(s) 216 may increase the effective surface area from which the liquid working fluid 208 may remove heat through convective cooling.

In some embodiments, the heat-generating components 214 include electronic or computing components or power supplies. In some embodiments, the heat-generating components 214 include computer devices, such as individual personal computer or server blade computers. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid working fluid 208 to a vapor phase requires the input of thermal energy to overcome the latent heat of vaporization and may be an effective mechanism to increase the thermal capacity of the working fluid and remove heat from the heat-generating components 214. Because the vapor working fluid 210 rises in the liquid working fluid 208, the vapor working fluid 210 can be extracted from the immersion chamber 204 in an upper vapor region of the chamber. A condenser 206 cools part of the vapor working fluid 210 back into a liquid working fluid 208, removing thermal energy from the system and reintroducing the working fluid into the immersion bath 212 of the liquid working fluid 208. The condenser 206 radiates or otherwise dumps the thermal energy from the working fluid into the ambient environment or into a conduit to carry the thermal energy away from the cooling system.

In some embodiments of immersion cooling systems, a liquid-cooled condenser is integrated into the immersion tank and/or the chamber to efficiency remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor working fluid 210 to enter the condenser 206 from the immersion tank 202 and/or chamber 204 and a liquid return line 220 that connects the immersion tank 202 to the condenser 206 and allows liquid working fluid 208 to return to the immersion tank 202 and/or chamber 204.

The vapor return line 218 may be colder than the boiling temperature of the working fluid. In some embodiments, a portion of the vapor working fluid 210 condenses in the vapor return line 218. The vapor return line 218 can, in some embodiments, be oriented at an angle such that the vapor return line 218 is non-perpendicular to the direction of gravity. The condensed working fluid can then drain either back to the immersion tank 202 or forward to the condenser 206 depending on the direction of the vapor return line 218 slope. In some embodiments, the vapor return line 218 includes a liquid collection line or valve, like a bleeder valve, that allows the collection and/or return of the condensed working fluid to the immersion tank 202 or condenser 206.

In some examples, an immersion cooling system 200 includes an air-cooled condenser 206. An air-cooled condenser 206 may require fans or pumps to force ambient air over one or more heat pipes or fins to conduct heat from the condenser to the air. In some embodiments, the circulation of immersion working fluid through the immersion cooling system 200 causes liquid working fluid 208 to flow past one or more heat-generating components 214. In the example of a heat-generating component 214 with a vapor chamber heat sink, the dynamics of liquid working fluid 208 may be used to move vapor chamber working fluid within the vapor chamber and/or the boiling of the immersion working fluid by the vapor chamber may drive flow of the immersion working fluid.

In some embodiments, the liquid working fluid receives heat in a cooling volume of working fluid immediately surrounding the heat-generating components. The cooling volume is the region of the working fluid (including both liquid and vapor phases) that is immediately surrounding the heat-generating components and is responsible for the convective cooling of the heat-generating components. In some embodiments, the cooling volume is the volume of working fluid within 5 millimeters (mm) of the heat-generating components.

The immersion working fluid has a boiling temperature below a critical temperature at which the heat-generating components experience thermal damage. The immersion working fluid can thereby receive heat from the heat-generating components to cool the heat-generating components before the heat-generating components experience damage.

For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the working fluid includes glycol. In some embodiments, the working fluid includes a combination of water and glycol. In some embodiments, the working fluid includes an aqueous solution. In some embodiments, the working fluid includes an electronic liquid, such as FC-72 available from 3M, or similar non-conductive fluids. In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Figure 3:
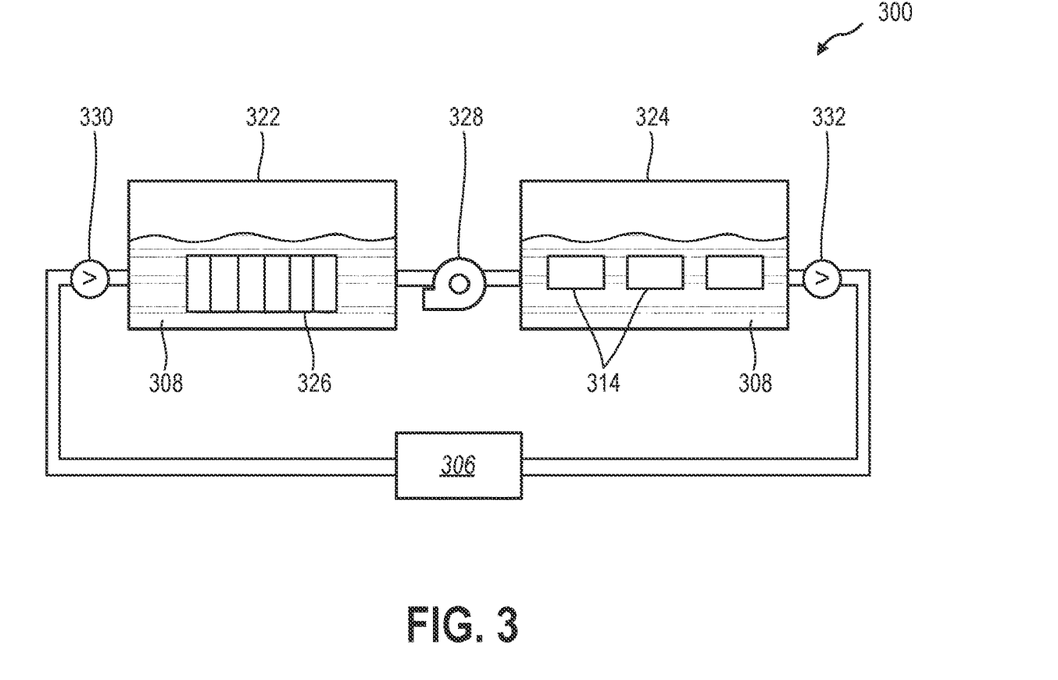
FIG. 3 is a system diagram of an immersion cooling system, according to at least one embodiment of the present disclosure.

FIG. 3 is a system diagram of an embodiment of an immersion cooling system 300 according to the present disclosure. In some embodiments, it is desirable to include batteries in or near racks or containers of computing components. For example, the batteries may provide back-up electrical power to the computing components during a loss of power or a reduction in power. In some examples, the batteries provide conditioning of the electrical power where the computing components would otherwise be exposed to unstable power sources. In some examples, the batteries can provide power to the computing components, when needed, and engage in grid services, when needed, to provide electrical power back into an external power grid, as will be described in more detail herein.

In some embodiments, the immersion cooling system 300 can include a first container 322 (e.g., an immersion tank) and a second container 324 (e.g., an immersion tank) that share a liquid working fluid 308 between the containers. In some embodiments, a battery 326 (or batteries) is positioned in the first container 322, and heat-generating components 314, such as processors, system memory, power supplies, other electronic components, or other heat-generating components, are positioned in the second container 324. The battery 326 and the heat-generating components 314 may experience thermal damage or degradation at different temperatures. Therefore, it is desirable to maintain the battery 326 at a first operating temperature and the heat-generating components 314 at a second operating temperature. In a particular example, the battery 326 has improved performance and increased operational lifetime when maintained at a first operating temperature that is less than the second operating temperature of the heat-generating components 314 of a server computer in the second container 324.

Two-phase immersion cooling holds the hot components in the working fluid in contact with the working fluid until the liquid working fluid boils. The vapor working fluid rising away from the hot component will be replaced by additional liquid working fluid, which cools the hot component. Unless the immersion cooling system experiences a dryout or other condition in which the liquid working fluid cannot replace the vapor working fluid at the contact surface with the hot components, the liquid working fluid will maintain the surface of the hot components (e.g., the battery 326, heat-generating components 314) at the boiling temperature of the working fluid.

In conventional systems where the desired operating temperature of a first component is different from that of a second component, two different working fluids with different boiling temperatures are used to maintain the first components at the first operating temperature and the second components at the second operating temperature. For example, the battery 326 in the first container 322 may have a first operating temperature of 30° C., above which the battery 326 experiences accelerated degradation during operation, and the heat-generating components 314 of the second container 324 may have an operating temperature of 50° C. In a conventional immersion cooling system, a first working fluid with a boiling temperature at or near 30° C. is used in the first container 322, and a second working fluid with a boiling temperature at or near 50° C. is used in the second container 324. However, using two different fluids requires separate conduits (i.e., pipes), separate pumps, storage tanks, handling facilities, and separate sets of compatibility standards with the components cooled by the working fluids.

In some embodiments according to the present disclosure, an immersion cooling system 300 uses a single working fluid and changes the boiling temperature of the working fluid by changing a pressure by way of one or more pressure differential control devices. Because the boiling temperature of a fluid is related to the pressure of the fluid, a first pressure in the first container 322 and a second pressure in the second container 324 higher than the first pressure provides a first boiling temperature in the first container 322 and a second boiling temperature greater than the first boiling temperature in the second container 324. The boiling temperature increases with increasing pressure, and a low-pressure (LP) container will have a lower boiling temperature than a high-pressure (HP) container.

A portion of the liquid working fluid 308 in the first container 322 (e.g., the LP container) will boil at the first boiling temperature to maintain the battery 326 at the first boiling temperature. The vapor working fluid 310 and/or liquid working fluid 308 is then delivered to the second container 324 at a higher pressure to provide a higher second boiling temperature of the liquid working fluid 308. In some embodiments, increasing the pressure condenses at least a portion of the vapor working fluid 310 between the LP container and the HP container. A portion of the liquid working fluid 308 in the second container 324 (e.g., the HP container) will boil at the second boiling temperature to maintain the heat-generating components 314 at the second boiling temperature. The vapor working fluid 310 is cycled through the immersion cooling system 300 to a condenser 306 to condense the vapor working fluid 310 back into a liquid working fluid, and the liquid working fluid 308 is returned to the first container 322. In some embodiments, the condenser 306 is the only condenser in thermal communication with the working fluid. For example, no other condenser is used that is in thermal communication with the working fluid. In another example, the condenser 306 may have a coil that contacts the working fluid (vapor or liquid phase) to cool and condense the working fluid. In some embodiments, the condenser 306 may not directly contact the working fluid but may be in thermal communication with the working fluid through one or more thermal transfer features such as fins, rods, heat pipes, vapor chambers or other thermally conductive or convective features or structures to allow the condenser to transfer heat away from the working fluid.

The first pressure and second pressure (or the pressure differential therebetween) can be controlled and/or created by pressure differential control devices in a variety of ways. In some embodiments, the pressure differential control device(s) includes a pump 328 positioned between the first container 322 and the second container 324. The pump 328 can pump the liquid working fluid 308 and/or the vapor working fluid 310 from the first container 322 to the second container 324.

The immersion cooling system 300 includes other pressure differential control devices, such as an inlet valve 330 (e.g., a regulator valve) that controls a flowrate of the working fluid drawn into the first container 322. In some embodiments, limiting a flowrate into a container while pumping working fluid out of the container with a pump 328 depressurizes the container. The resulting LP container has a lower fluid pressure and a lower boiling temperature of the working fluid therein.

The immersion cooling system 300 includes additional pressure differential control devices, such as an outlet valve 332 (e.g., a regulator valve) that controls a flowrate of the working fluid exhausted from the second container 324. In some embodiments, limiting a flowrate out of a container while pumping working fluid into the container with a pump 328 pressurizes the container. The resulting HP container has a higher fluid pressure and a higher boiling temperature of the working fluid therein.

In some embodiments, a pressure difference between the LP container and the HP container of the immersion cooling system 300 provides at least a 5° C. difference between the first boiling temperature of the working fluid in the LP container and the second boiling temperature of the working fluid in the HP container. In some embodiments, a pressure difference between the LP container and the HP container of the immersion cooling system 300 provides at least a 10° C. difference between the first boiling temperature of the working fluid in the LP container and the second boiling temperature of the working fluid in the HP container. In some embodiments, a pressure difference between the LP container and the HP container of the immersion cooling system 300 provides at least a 15° C. difference between the first boiling temperature of the working fluid in the LP container and the second boiling temperature of the working fluid in the HP container.

Figure 4:
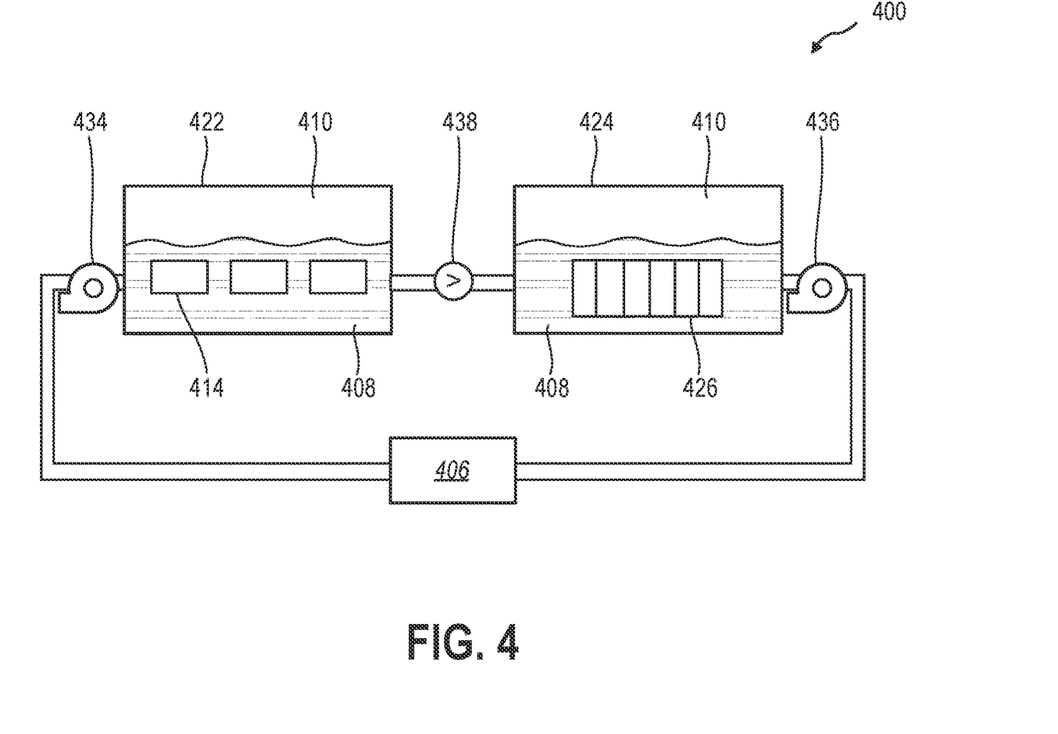
FIG. 4 is a system diagram of another immersion cooling system, according to at least one embodiment of the present disclosure.

FIG. 4 is another embodiment of an immersion cooling system 400 with a pressure difference between an LP container and an HP container and pressure differential control devices, such as pumps, valves, or pressure trim devices, to maintain or create the pressure difference. In the embodiment described above, the working fluid is circulated through the immersion cooling system with the working fluid first entering the LP container and then entering the HP container. In some embodiments, such as illustrated in FIG. 4, the working fluid enters the HP container first and the LP container second. The first container 422 is the HP container with an inlet pump 434 positioned before the first container 422 to pump liquid working fluid 408 into the first container and pressurize the first container 422.

A valve is positioned between the first container 422 and the second container 424 to limit the flow of liquid working fluid 408 and/or vapor working fluid 410 from the first container 422 to the second container 424 to maintain the high-pressure region in the first container 422 around the heat-generating components 414. The high-pressure region around the heat-generating components 414 causes the liquid working fluid 408 to have a higher boiling temperature and keep the heat-generating components 414 of the computing device(s) at a higher operating temperature than the battery 426 of the second container 424.

In some embodiments, such as that illustrated in FIG. 4, an outlet pump 436 is positioned after the LP container (e.g., the second container 424 of FIG. 4) to further depressurize the LP container to lower the boiling temperature of the liquid working fluid 408 therein and keep the battery 426 at a lower operating temperature than the heat-generating components 414 of the computing device(s) of the first container 422. The vapor working fluid 410 may then flow to the condenser 406, which condenses the vapor working fluid 410 back to a liquid phase of the working fluid before returning the liquid working fluid 408 to the first container 422.

In some embodiments, a first container is positioned inside a second container. For example, an HP container may be positioned inside an LP container and configured to vent working fluid into the LP container. In another example, an LP container may be positioned inside an HP container and configured to vent working fluid into the HP container.

Figure 5:
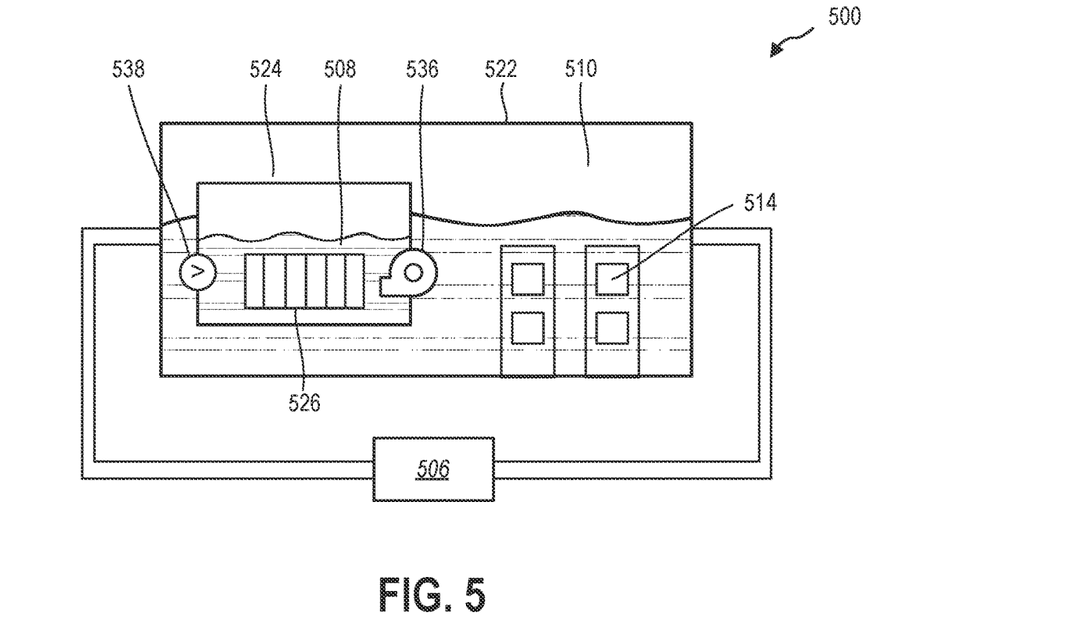
FIG. 5 is a system diagram of an immersion cooling system with a low-pressure container inside a high-pressure container, according to at least one embodiment of the present disclosure.

Referring now to FIG. 5, a second container 524 is positioned inside a first container 522 of the immersion cooling system 500. The second container 524 receives liquid working fluid 508 from the first container 522 through an intermediate valve 538 that regulates or limits a flowrate of the liquid working fluid 508 into the second container 524.

The outlet pump 536 draws working fluid from the second container 524 into the first container 522 to depressurize the second container 524 and to lower the boiling temperature of the liquid working fluid 508 therein and keep the battery 526 at a lower operating temperature than the heat-generating components 514 of the computing device(s) of the first container 522. The vapor working fluid 510 may then flow to the condenser 506, which condenses the vapor working fluid 510 back to a liquid phase of the working fluid before returning the liquid working fluid 508 to the first container 522.

Figure 6:
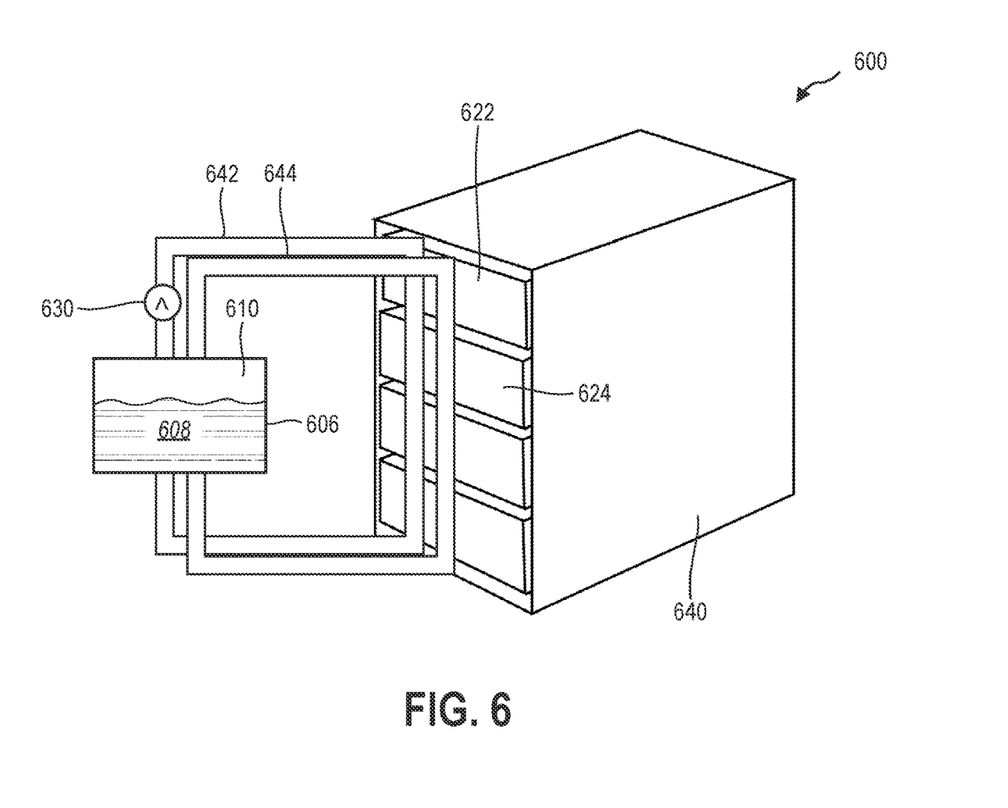
FIG. 6 is a perspective view of a server rack with a low-pressure container and a high-pressure container, according to at least one embodiment of the present disclosure.

In some embodiments, the first container and second container are held in and/or support by a server rack in a datacenter. FIG. 6 illustrates an embodiment of an immersion cooling system 600 with a first container 622 and a second container 624 in a server rack 640 where the first container 622 and second container 624 are held at different fluid pressures. The server rack 640 is coupled to a plurality of circulation conduits 642, 644 that each provide fluid couplings to containers 622, 624 in the server rack 640. In some embodiments, the containers 622, 624 have different fluid couplings thereon, such that when inserted into the server rack 640, the containers 622, 624 will couple to the appropriate circulation conduits 642, 644 for the desired pressure (and hence boiling temperature) for that container 622, 624.

In some embodiments, a condenser 606 includes a fluid pump to pump liquid working fluid 608 from the condenser 606 into the circulation conduits 642, 644. An inlet valve 630 is positioned on a first circulation conduit 642 to limit and/or regulate a flowrate of working fluid into the first container 622, which depressurizes the first container 622. The working fluid flows into the second container 624 with less restriction on the flow (and/or a greater flowrate), allowing the second container 624 to be pressurized with a greater fluid pressure than the first container 622. Therefore, the liquid working fluid 608 in the first container 622 has lower boiling temperature than the liquid working fluid 608 in the second container 624.

Figure 7:
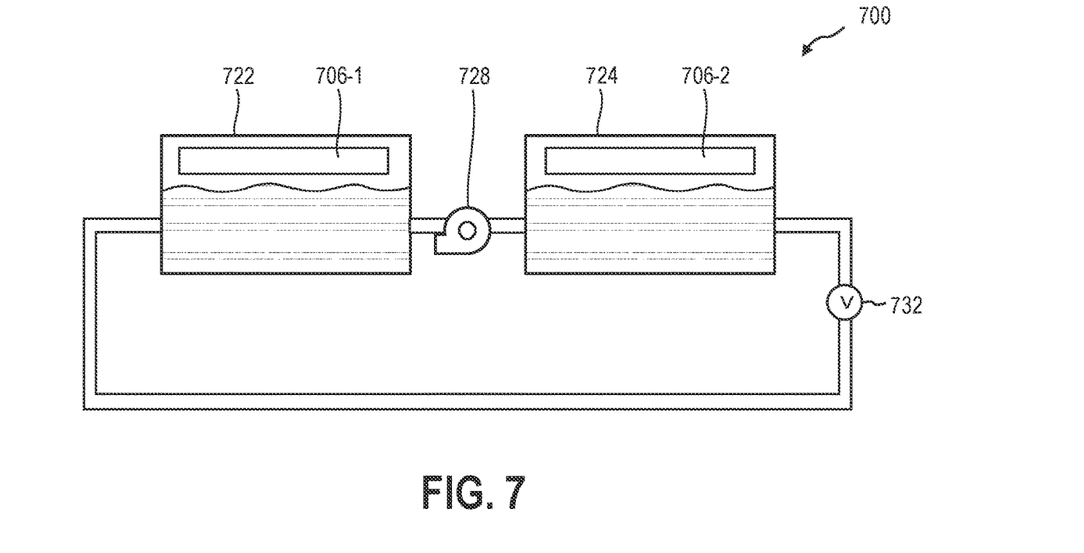
FIG. 7 is a system diagram of an immersion cooling system with condensers in a low-pressure container and a high-pressure container, according to at least one embodiment of the present disclosure.

While embodiments have been described herein with external condensers configured to condense the vapor working fluid, some embodiments of immersion cooling systems 700 according to the present disclosure have a condenser located in one or both of the first container 722 and second container 724, as illustrated in FIG. 7. In some embodiments, an intermediate pump 728 and outlet valve 732 adjust the pressure differential between the first container 722 with a first condenser 706-1 and the second container 724 with a second condenser 706-2. In other embodiments, the pressure differential between the first container 722 and the second container 724 can be changed or controlled through any of the mechanisms and/or methods described herein.

Figure 8:
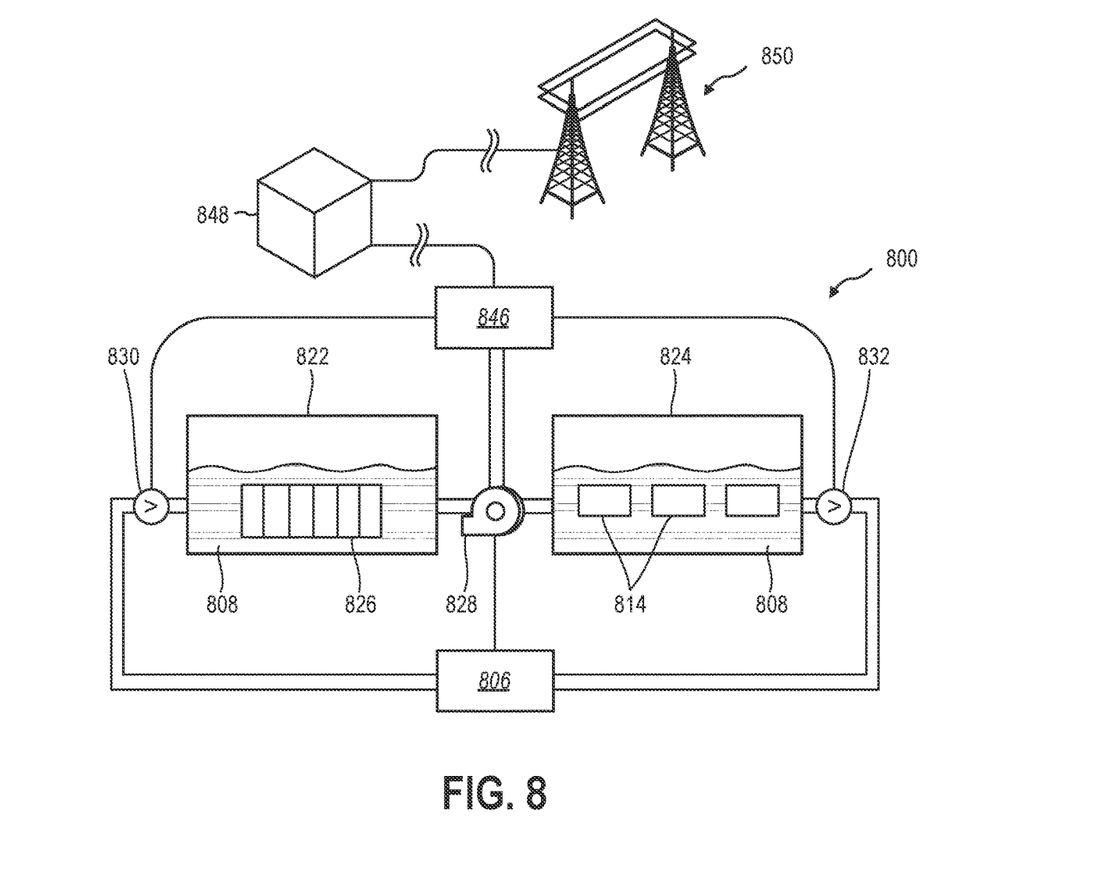
FIG. 8 is a system diagram of an immersion cooling system in data communication with an external power grid, according to at least one embodiment of the present disclosure.

FIG. 8 illustrates another embodiment of an immersion cooling system 800 with a battery 826 that can participate in grid services with an external power grid. In some embodiments, the battery 826 of the immersion cooling system 800 is more efficiently charged or discharged based, at least partially, on the conditions of an external power grid. The immersion cooling system 800 includes a controller 846 that is in data communication with one or more components of the immersion cooling system 800, such as the condenser 806, the intermediate pump 828, the inlet valve 830, the outlet valve 832, or other components of the immersion cooling system 800 to adjust and/or control a pressure difference between the first container 822 and the second container 824. In some embodiments, the controller 846 is further in data communication with a substation 848 or other portion of an external power grid 850. The controller 846 may receive grid data related to the operating conditions of the external power grid 850 (power demand, frequency, or any external signal, electricity price, costs, etc.), and the controller 846 may use the grid data to adjust the fluid pressure of the first container 822 and/or the second container 824, and therefore, the boiling temperature of the liquid working fluid 808 therein.

In some embodiments, the controller 846 is or is part of a uninterruptable power supply (UPS) or battery management system (BMS). For example, the controller 846 may be part of the UPS and include inverter and/or rectifier controls. In some examples, the controller 836 may be part of the BMS and in communication with and/or management of the battery 826 to exchange information between the batter 826 and other devices. In a particular example, the UPS or other electronic device may send a command to the battery to discharge the battery during a power outage to serve an IT load. In the case of grid services, the UPS or other electronic device may monitor a status of the battery and the external power grid and send command(s) to charge or discharge the battery for external power grid services.

In some embodiments, the battery 826 only requires thermal management during charging or discharging of the battery 826. For example, the battery may not experience damage or degradation during storage at the boiling temperature of the liquid working fluid 808 when at a fluid pressure substantially equal to that of the second container 824. When the controller 846 determines or detects a change in battery operation (e.g., charging, discharging, or a change in the rate of charging or discharging) the controller 846 can adjust the fluid pressure in the first container 822 to lower the boiling temperature of the liquid working fluid therein to keep the battery 826 at a lower operating temperature than the heat-generating components of the second container 824.

In some embodiments, the controller 846 changes the fluid pressure in the first container 822 in response to detecting a change in battery operation, such as participating in grid services or providing additional power to the heat-generating components 814 of the second container. In some embodiments, the controller 846 proactively changes the fluid pressure in the first container 822 in response to determining a future change in battery operation, such as determining, at least partially from the grid data, that the battery 826 will be participating in grid services from historic trends of power demands and requirements.

Figure 9:
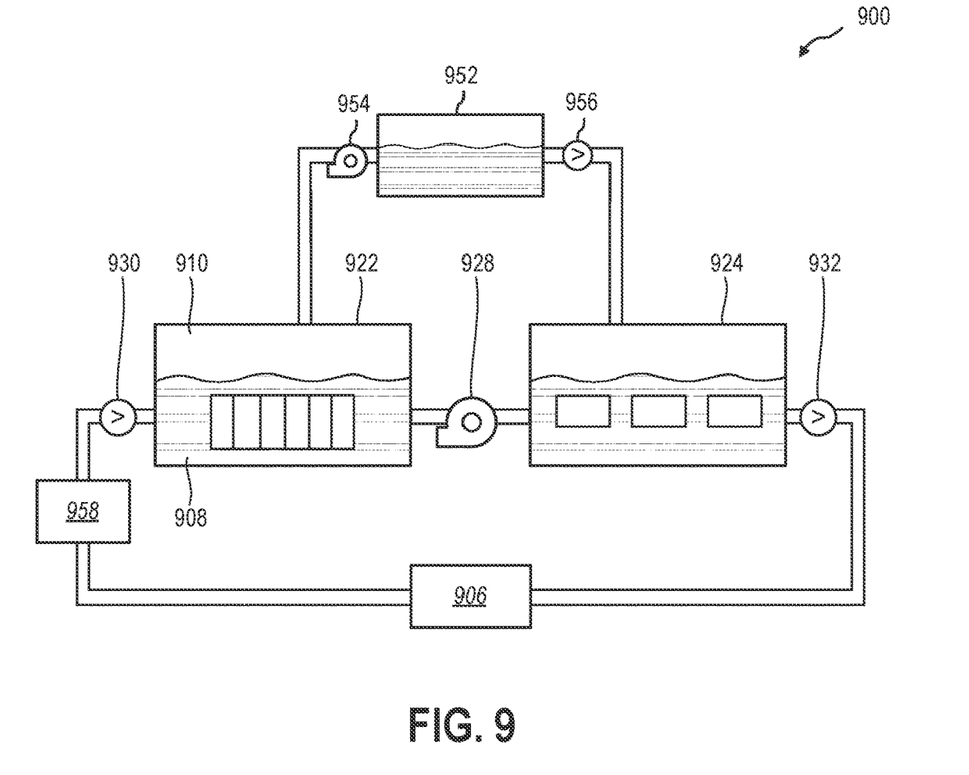
FIG. 9 is a system diagram of an immersion cooling system with a storage tank to adjust fluid pressures in a low-pressure container and a high-pressure container, according to at least one embodiment of the present disclosure.

Referring now to FIG. 9, in some embodiments, an immersion cooling system 900 includes another pressure differential control device, such as a storage tank or other pressure trim device to add or remove working fluid from the first container 922 and/or second container 924 to adjust a fluid pressure and/or temperature in the container(s). In some embodiments, changes in the fluid pressure of the first container 922 and/or second container 924 are made by changing the flowrate of working fluid through pressure differential control devices, such as an intermediate pump 928, an inlet valve 930, an outlet valve 932, or combinations thereof. In some embodiments, more rapid changes to the fluid pressure of the first container 922 and/or second container 924 can be made by flowing a portion of the working fluid to and/or from a storage tank 952.

In some embodiments, flow of working fluid to and/or from the storage tank 952 may be controlled by valves and/or pumps, such as a storage inlet pump 954 and/or a storage outlet valve 956. In some embodiments, a fluid pressure in the first container 922 may be adjusted rapidly by pumping or venting excess working fluid (liquid working fluid 908 or vapor working fluid 910) from the first container 922 to the storage tank 952. In some embodiments, a fluid pressure in the second container 924 may be adjusted rapidly by pumping or venting supplemental working fluid (liquid working fluid 908 or vapor working fluid 910) from the storage tank 952 to the second container 924.

In some embodiments, the working fluid condensed by the condenser 906 and received from the second container 924 may be at or near the boiling temperature of the working fluid in the second container 924. To ensure the liquid working fluid entering the first container 922 is at or near the boiling temperature of the working fluid in the first container 922, some embodiments of immersion cooling systems 900 include a heat exchanger 958 configured to pre-cool the liquid working fluid 908 being returned to the first container 922.

In at least some embodiments, the condenser 906 pre-cools the liquid working fluid by condensing the working fluid at or near the boiling temperature of the working fluid in the first container 922. For example, the condenser 906 may be at the same or similar fluid pressure as the first container 922, such that working fluid condensed by the condenser will be condensed at or near the boiling temperature of the working fluid in the first container 922.

Figure 10:
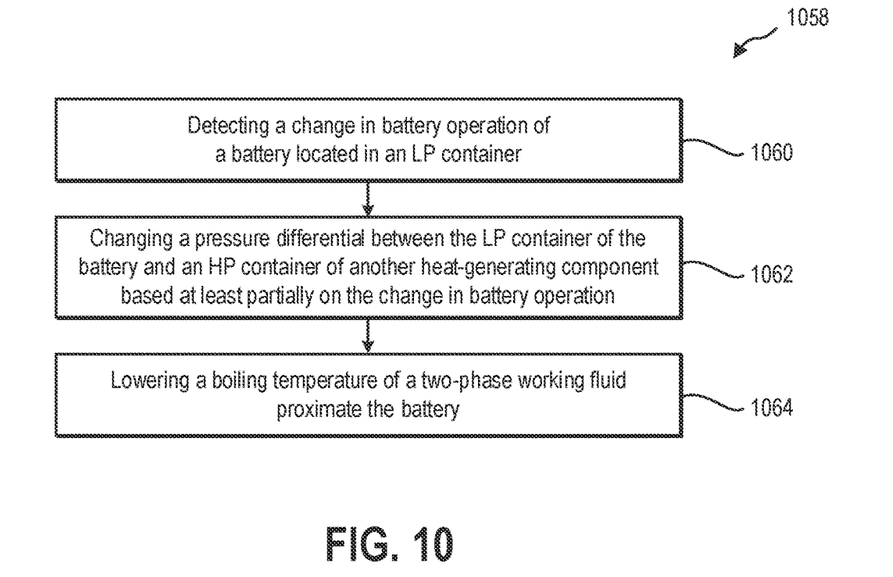
FIG. 10 is a flowchart illustrating a method of thermal management, according to at least one embodiment of the present disclosure.

FIG. 10 illustrates a flowchart of an embodiment of a method 1058 of thermal management, according to the present disclosure. In some embodiments, a pressure differential between a first container (e.g., an LP container) and a second container (e.g., an HP container) is adjusted dynamically based on the thermal management demands of the LP container holding a battery or bank of batteries. The method 1058 includes detecting a change in battery operation (such as described in relation to FIG. 8) of a battery located in the LP container at 1060. In some embodiments, detecting the change includes receiving measurements from the battery, such as current, voltage, or temperature, and/or measurements from a heat-generating component in the HP container, such as processing load, power draw, IT load, etc. In some embodiments, detecting the change includes determining a future change in battery operation, such as predicting a participation in grid services or additional power demands from the computing components and/or devices of the datacenter.

The method 1058 further includes changing a pressure differential between the LP container and an HP container of another heat-generating component based at least partially on the change in battery operation at 1062. In some embodiments, changing the pressure differential includes reducing a fluid pressure in the LP container. In some embodiments, changing the pressure differential includes pre-cooling the working fluid entering the LP container. In some embodiments, changing the pressure differential includes reducing an IT load of the heat-generating components in the HP container. In some embodiments, changing the pressure differential includes venting at least a portion of the working fluid from the LP container. In some embodiments, changing the pressure differential includes adding cold liquid working fluid to the LP container to limit additional vaporization of the working fluid in the LP container. In some embodiments, changing the pressure differential includes adding vapor working fluid to the HP container. In some embodiments, changing the pressure differential includes changing a condensation rate of a condenser of the immersion cooling system. For example, by lowering a temperature of a condenser coil in the condenser, more vapor working fluid is condensed by the condenser, lowering the fluid pressure in the condenser and lowering the fluid pressure in the LP container. In some embodiments, changing the condensation rate of the condenser includes changing a fluid pressure in the condenser to change the condensation temperature (e.g., boiling temperature) of the working fluid the condenser and therefore the temperature of the working fluid that flows to the LP container.

The method 1058 further includes lowering the boiling temperature of the two-phase working fluid proximate the battery in the LP container at 1064. As described herein, the fluid pressure in the container of the battery affects the boiling temperature of the working fluid therein. Lowering the fluid pressure in the LP container lowers the boiling temperature of the two-phase working fluid proximate the battery in the LP container to keep the battery in a safe range of operating temperatures.

INDUSTRIAL APPLICABILITY

The present disclosure relates generally to systems and methods for thermal management of electronic devices or other heat-generating components. In some embodiments, immersion cooling systems described herein allow for changes to be made to a fluid pressure in an immersion tank. The fluid pressure in the container(s) of the immersion cooling system can change the boiling temperature, allowing a single working fluid to maintain different components at different operating temperatures.

In some embodiments, the immersion cooling system can include a first container (e.g., an immersion tank) and a second container (e.g., an immersion tank) that share a liquid working fluid between the containers. In some embodiments, a battery (or batteries) is positioned in the first container, and heat-generating components, such as processors, system memory, power supplies, other electronic components, or other heat-generating components, are positioned in the second container. The battery and the heat-generating components may experience thermal damage or degradation at different temperatures. Therefore, it is desirable to maintain the battery at a first operating temperature and the heat-generating components at a second operating temperature. In a particular example, the battery has improved performance and increased operational lifetime when maintained at a first operating temperature that is less than the second operating temperature of the heat-generating components of a server computer in the second container.

Two-phase immersion cooling holds the hot components in the working fluid in contact with the working fluid until the liquid working fluid boils. The vapor working fluid rising away from the hot component will be replaced by additional liquid working fluid, which cools the hot component. Unless the immersion cooling system experiences a dryout or other condition in which the liquid working fluid cannot replace the vapor working fluid at the contact surface with the hot components, the liquid working fluid will maintain the surface of the hot components (e.g., the battery, heat-generating components) at the boiling temperature of the working fluid.

In conventional systems where the desired operating temperature of a first component is different from that of a second component, two different working fluids with different boiling temperatures are used to maintain the first components at the first operating temperature and the second components at the second operating temperature. For example, the battery in the first container may have a first operating temperature of 30° C., above which the battery experiences accelerated degradation during operation, and the heat-generating components of the second container may have an operating temperature of 50° C. In a conventional immersion cooling system, a first working fluid with a boiling temperature at or near 30° C. is used in the first container, and a second working fluid with a boiling temperature at or near 50° C. is used in the second container. However, using two different fluids requires separate conduits (i.e., pipes), separate pumps, storage tanks, handling facilities, and separate sets of compatibility standards with the components cooled by the working fluids.

In some embodiments according to the present disclosure, an immersion cooling system uses a single working fluid and changes the boiling temperature of the working fluid by changing a pressure by way of one or more pressure differential control devices. Because the boiling temperature of a fluid is related to the pressure of the fluid, a first pressure in the first container and a second pressure in the second container higher than the first pressure provides a first boiling temperature in the first container and a second boiling temperature greater than the first boiling temperature in the second container. The boiling temperature increases with increasing pressure, and a low-pressure (LP) container will have a lower boiling temperature than a high-pressure (HP) container.

A portion of the liquid working fluid in the first container (e.g., the LP container) will boil at the first boiling temperature to maintain the battery at the first boiling temperature. The vapor working fluid and/or liquid working fluid is then delivered to the second container at a higher pressure to provide a higher second boiling temperature of the liquid working fluid. In some embodiments, increasing the pressure condenses at least a portion of the vapor working fluid between the LP container and the HP container. A portion of the liquid working fluid in the second container (e.g., the HP container) will boil at the second boiling temperature to maintain the heat-generating components at the second boiling temperature. The vapor working fluid is cycled through the immersion cooling system to a condenser to condense the vapor working fluid back into a liquid working fluid, and the liquid working fluid is returned to the first container. In some embodiments, the condenser is the only condenser in thermal communication with the working fluid. For example, the condenser may have a coil that is contacts the working fluid (vapor or liquid phase) to cool and condense the working fluid. In some embodiments, the condenser may not directly contact the working fluid but may be in thermal communication with the working fluid through one or more thermal transfer features such as fins, rods, heat pipes, vapor chambers or other thermally conductive or convective features or structures to allow the condenser to transfer heat away from the working fluid.

The first pressure and second pressure (or the pressure differential therebetween) can be controlled and/or created in a variety of ways by pressure differential control devices. In some embodiments, the pressure differential control device(s) includes a pump positioned between the first container and the second container. The pump can pump the liquid working fluid and/or the vapor working fluid from the first container to the second container.

The immersion cooling system includes other pressure differential control devices, such as an inlet valve (e.g., a regulator valve) that controls a flowrate of the working fluid drawn into the first container. In some embodiments, limiting a flowrate into a container while pumping working fluid out of the container with a pump depressurizes the container. The resulting LP container has a lower fluid pressure and a lower boiling temperature of the working fluid therein.

The immersion cooling system includes additional pressure differential control devices, such as an outlet valve (e.g., a regulator valve) that controls a flowrate of the working fluid exhausted from the second container. In some embodiments, limiting a flowrate out of a container while pumping working fluid into the container with a pump pressurizes the container. The resulting HP container has a higher fluid pressure and a higher boiling temperature of the working fluid therein.

In some embodiments, a pressure difference between the LP container and the HP container of the immersion cooling system provides at least a 5° C. difference between the first boiling temperature of the working fluid in the LP container and the second boiling temperature of the working fluid in the HP container. In some embodiments, a pressure difference between the LP container and the HP container of the immersion cooling system provides at least a 10° C. difference between the first boiling temperature of the working fluid in the LP container and the second boiling temperature of the working fluid in the HP container. In some embodiments, a pressure difference between the LP container and the HP container of the immersion cooling system provides at least a 15° C. difference between the first boiling temperature of the working fluid in the LP container and the second boiling temperature of the working fluid in the HP container.

In some embodiments, the working fluid is circulated through the immersion cooling system with the working fluid first entering the LP container and then entering the HP container with a pressure difference maintained and/or created by and pressure differential control devices, such as pumps, valves, or pressure trim devices. In some embodiments, the working fluid enters the HP container first and the LP container second. The first container is the HP container with an inlet pump positioned before the first container to pump liquid working fluid into the first container and pressurize the first container.

A valve is positioned between the first container and the second container to limit the flow of liquid working fluid and/or vapor working fluid from the first container to the second container to maintain the high-pressure region in the first container around the heat-generating components. The high-pressure region around the heat-generating components causes the liquid working fluid to have a higher boiling temperature and keep the heat-generating components of the computing device(s) at a higher operating temperature than the battery of the second container.

In some embodiments, an outlet pump is positioned after the LP container (e.g., the second container) to further depressurize the LP container to lower the boiling temperature of the liquid working fluid therein and keep the battery at a lower operating temperature than the heat-generating components of the computing device(s) of the first container. The vapor working fluid may then flow to the condenser, which condenses the vapor working fluid back to a liquid phase of the working fluid before returning the liquid working fluid to the first container.

In some embodiments, a first container is positioned inside a second container. For example, an HP container may be positioned inside an LP container and configured to vent working fluid into the LP container. In another example, an LP container may be positioned inside an HP container and configured to vent working fluid into the HP container.

In at least some embodiments, a second container is positioned inside a first container of the immersion cooling system. The second container may receive liquid working fluid from the first container through an intermediate valve that regulates or limits a flowrate of the liquid working fluid into the second container.

An outlet pump draws working fluid from the second container into the first container to depressurize the second container and to lower the boiling temperature of the liquid working fluid therein and keep the battery at a lower operating temperature than the heat-generating components of the computing device(s) of the first container. The vapor working fluid may then flow to the condenser, which condenses the vapor working fluid back to a liquid phase of the working fluid before returning the liquid working fluid to the first container.

In some embodiments, the first container and second container are held in and/or support by a server rack in a datacenter. In some embodiments, an immersion cooling system has a first container and a second container in a server rack where the first container and second container are held at different fluid pressures. The server rack is coupled to a plurality of circulation conduits that each provide fluid couplings to containers in the server rack. In some embodiments, the containers have different fluid couplings thereon, such that when inserted into the server rack, the containers will couple to the appropriate circulation conduits for the desired pressure (and hence boiling temperature) for that container.

In some embodiments, a condenser includes a fluid pump to pump liquid working fluid from the condenser into the circulation conduits. An inlet valve is positioned on a first circulation conduit to limit and/or regulate a flowrate of working fluid into the first container, which depressurizes the first container. The working fluid flows into the second container with less restriction on the flow (and/or a greater flowrate), allowing the second container to be pressurized with a greater fluid pressure than the first container. Therefore, the liquid working fluid in the first container has lower boiling temperature than the liquid working fluid in the second container.

While embodiments have been described herein with external condensers configured to condense the vapor working fluid, some embodiments of immersion cooling systems according to the present disclosure have a condenser located in one or both of the first container and second container. In some embodiments, an intermediate pump and outlet valve adjust the pressure differential between the first container with a first condenser and the second container with a second condenser. In other embodiments, the pressure differential between the first container and the second container can be changed or controlled through any of the mechanisms and/or methods described herein.

In some embodiments, an immersion cooling system has a battery that can participate in grid services with an external power grid. In some embodiments, the battery of the immersion cooling system is more efficiently charged or discharged based, at least partially, on the conditions of an external power grid. The immersion cooling system includes a controller that is in data communication with one or more components of the immersion cooling system, such as the condenser, the intermediate pump, the inlet valve, the outlet valve, or other components of the immersion cooling system to adjust and/or control a pressure difference between the first container and the second container. In some embodiments, the controller is further in data communication with a substation or other portion of an external power grid. The controller may receive grid data related to the operating conditions of the external power grid (power demand, frequency, or any external signal, electricity price, costs, etc.), and the controller may use the grid data to adjust the fluid pressure of the first container and/or the second container, and therefore, the boiling temperature of the liquid working fluid therein.

In some embodiments, the controller is or is part of a uninterruptable power supply (UPS) or battery management system (BMS). For example, the controller may be part of the UPS and include inverter and/or rectifier controls. In some examples, the controller may be part of the BMS and in communication with and/or management of the battery to exchange information between the batter and other devices. In a particular example, the UPS or other electronic device may send a command to the battery to discharge the battery during a power outage to serve an IT load. In the case of grid services, the UPS or other electronic device may monitor a status of the battery and the external power grid and send command(s) to charge or discharge the battery for external power grid services.

In some embodiments, the battery only requires thermal management during charging or discharging of the battery. For example, the battery may not experience damage or degradation during storage at the boiling temperature of the liquid working fluid when at a fluid pressure substantially equal to that of the second container. When the controller determines or detects a change in battery operation (e.g., charging, discharging, or a change in the rate of charging or discharging) the controller 846 can adjust the fluid pressure in the first container to lower the boiling temperature of the liquid working fluid therein to keep the battery at a lower operating temperature than the heat-generating components of the second container.

In some embodiments, the controller changes the fluid pressure in the first container in response to detecting a change in battery operation, such as participating in grid services or providing additional power to the heat-generating components of the second container. In some embodiments, the controller proactively changes the fluid pressure in the first container in response to determining a future change in battery operation, such as determining, at least partially from the grid data, that the battery will be participating in grid services from historic trends of power demands and requirements.

In some embodiments, an immersion cooling system includes a storage tank or other pressure trim device to add or remove working fluid from the first container and/or second container to adjust a fluid pressure and/or temperature in the container(s). In some embodiments, changes in the fluid pressure of the first container and/or second container are made by changing the flowrate of working fluid through an intermediate pump, an inlet valve, an outlet valve, or combinations thereof. In some embodiments, more rapid changes to the fluid pressure of the first container and/or second container can be made by flowing a portion of the working fluid to and/or from a storage tank.

In some embodiments, flow of working fluid to and/or from the storage tank may be controlled by valves and/or pumps, such as a storage inlet pump and/or a storage outlet valve. In some embodiments, a fluid pressure in the first container may be adjusted rapidly by pumping or venting excess working fluid (liquid working fluid or vapor working fluid) from the first container to the storage tank. In some embodiments, a fluid pressure in the second container may be adjusted rapidly by pumping or venting supplemental working fluid (liquid working fluid or vapor working fluid) from the storage tank to the second container.

In some embodiments, the working fluid condensed by the condenser and received from the second container may be at or near the boiling temperature of the working fluid in the second container. To ensure the liquid working fluid entering the first container is at or near the boiling temperature of the working fluid in the first container, some embodiments of immersion cooling systems include a heat exchanger configured to pre-cool the liquid working fluid being returned to the first container.

In at least some embodiments, the condenser pre-cools the liquid working fluid by condensing the working fluid at or near the boiling temperature of the working fluid in the first container. For example, the condenser may be at the same or similar fluid pressure as the first container, such that working fluid condensed by the condenser will be condensed at or near the boiling temperature of the working fluid in the first container.

In some embodiments, a pressure differential between a first container (e.g., an LP container) and a second container (e.g., an HP container) is adjusted dynamically based on the thermal management demands of the LP container holding a battery or bank of batteries. The method includes detecting a change in battery operation (such as described herein) of a battery located in the LP container. In some embodiments, detecting the change includes receiving measurements from the battery, such as current, voltage, or temperature, and/or measurements from a heat-generating component in the HP container, such as processing load, power draw, IT load, etc. In some embodiments, detecting the change includes determining a future change in battery operation, such as predicting a participation in grid services or additional power demands from the computing components and/or devices of the datacenter.

The method further includes changing a pressure differential between the LP container and an HP container of another heat-generating component based at least partially on the change in battery operation. In some embodiments, changing the pressure differential includes reducing a fluid pressure in the LP container. In some embodiments, changing the pressure differential includes pre-cooling the working fluid entering the LP container. In some embodiments, changing the pressure differential includes reducing an IT load of the heat-generating components in the HP container. In some embodiments, changing the pressure differential includes venting at least a portion of the working fluid from the LP container. In some embodiments, changing the pressure differential includes adding cold liquid working fluid to the LP container to limit additional vaporization of the working fluid in the LP container. In some embodiments, changing the pressure differential includes adding vapor working fluid to the HP container. In some embodiments, changing the pressure differential includes changing a condensation rate of a condenser of the immersion cooling system. For example, by lowering a temperature of a condenser coil in the condenser, more vapor working fluid is condensed by the condenser, lowering the fluid pressure in the condenser and lowering the fluid pressure in the LP container. In some embodiments, changing the condensation rate of the condenser includes changing a fluid pressure in the condenser to change the condensation temperature (e.g., boiling temperature) of the working fluid the condenser and therefore the temperature of the working fluid that flows to the LP container.

The method further includes lowering the boiling temperature of the two-phase working fluid proximate the battery in the LP container. As described herein, the fluid pressure in the container of the battery affects the boiling temperature of the working fluid therein. Lowering the fluid pressure in the LP container lowers the boiling temperature of the two-phase working fluid proximate the battery in the LP container to keep the battery in a safe range of operating temperatures.

The present disclosure relates to systems and methods for cooling electronic components and/or devices according to at least the examples provided in the sections below:

[A1] In some embodiments, a thermal management system includes an HP container, an LP container in fluid communication with the HP container and configured to have a fluid pressure less than the HP container, and configured to have a two-phase working fluid partially in the HP container and partially in the LP container. A pump is configured to move the working fluid through the system, and a condenser is configured to condense the vapor phase of the working fluid into the liquid phase.

[A2] In some embodiments, the condenser of [A1] is the only condenser in thermal communication with the working fluid.

[A3] In some embodiments, the condenser of [A1] is configured to condense working fluid in the HP container, and the system further comprises a second condenser configured to condense working fluid in the LP container.

[A4] In some embodiments, the pump of any [A1] through [A3] is configured to pressurize the HP container.

[A5] In some embodiments, the pump of any [A1] through [A4] is configured to depressurize the LP container.

[A6] In some embodiments, the LP container of any of [A1] through [A5] is located inside the HP container and the LP container exhausts working fluid into the HP container.

[A7] In some embodiments, the system of any of [A1] through [A6] includes a regulator valve before LP container in a direction of flow of the working fluid, and the regulator valve limits a flowrate of working fluid into the LP container.

[A8] In some embodiments, the system of any of [A1] through [A6] includes a storage tank configured to receive excess working fluid.

[B1] In some embodiments, a method of thermal management of electronic devices includes detecting a change in battery operation of a battery located in an LP container, changing a pressure differential between an LP container of the battery and an HP container of another heat-generating component based at least partially on the change in battery operation, and lowering a boiling temperature of a two-phase working fluid proximate the battery.

[B2] In some embodiments, the method of [B1] includes adding liquid phase working fluid to the LP container.

[B3] In some embodiments, the method of [B1] or [B2] includes venting the LP container.

[B4] In some embodiments, wherein changing a pressure differential of any of [B1] through [B3] includes increasing a condensation rate of the condenser.

[B5] In some embodiments, wherein changing a pressure differential of any of [B1] through [B4] includes pre-cooling the working fluid before the LP container in a direction of flow of the working fluid.

[B6] In some embodiments, wherein changing a pressure differential of any of [B1] through [B5] includes lowering a pressure in a condenser in thermal communication with the working fluid.

[B7] In some embodiments, the change in the battery operation of any of [B1] through [B6] includes a discharge of the battery.

[B8] In some embodiments, the change in battery operation of any of [B1] through [B7] includes charging the battery.

[B9] In some embodiments, detecting a change in battery operation of any of [B1] through [B9] includes detecting a future change in battery operation, and changing a pressure differential includes changing the pressure differential proactively before the future change occurs.

[B10] In some embodiments, the method of any of [B1] through [B9] reducing IT load in the HP container.

[C1] In some embodiments, a thermal management system includes a HP container, a LP container in fluid communication with the HP container and having a fluid pressure less than the HP container, and a two-phase working fluid partially in the HP container and partially in the LP container. The two-phase working fluid has a vapor phase and a liquid phase. A pump is configured to move the working fluid through the system, and a condenser is configured to condense the vapor phase of the working fluid into the liquid phase. A controller is in data communication with at least the pump and the condenser, and the controller is configured to change the pressure in the LP container with the pump or the condenser.

[C2] In some embodiments, the controller of [C1] is configured to receive grid data from an external power grid.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising:
   a first container having a first heat-generating component positioned within the first container and having a first portion of a working fluid positioned within the first container at least partially surrounding the first heat-generating component, wherein the first heat-generating component has a first operating temperature, wherein the first operating temperature is based on a first pressure, and wherein the working fluid has a first boiling point at the first operating temperature at the first pressure of the first container;
   a second container in fluid communication with the first container having a second heat-generating component positioned within the second container and having a second portion of the working fluid positioned within the second container at least partially surrounding the second heat-generating component, wherein the second heat-generating component has a second operating temperature, wherein the second operating temperature is based on a second pressure, and wherein the second portion of the working fluid has a second boiling point at the second operating temperature at the second pressure of the second container;
   a set of one or more pressure differential control devices configured to maintain the first portion of the working fluid at the first boiling point by maintaining the first container at the first pressure and configured to maintain the second portion of the working fluid at the second boiling point by maintaining the second container at the second pressure, the set of one or more pressure differential control devices including a pump configured to move the working fluid through a fluid path of the thermal management system; and
   a condenser configured to condense a vapor phase of the working fluid into a liquid phase.

2. The system of claim 1, wherein the condenser is the only condenser in thermal communication with the working fluid, wherein the condenser is positioned downstream of the second container on a fluid path, and wherein the pump is positioned between the first container and the second container on the fluid path.

3. The system of claim 1, wherein the second operating temperature and second boiling point are greater than the first operating temperature and first boiling point based on the second pressure of the second container being greater than the first pressure of the first container.

4. The system of claim 1, wherein the set of one or more pressure differential control devices includes an inlet valve positioned upstream of the first container on the fluid path and wherein the inlet valve and the pump maintain the first pressure of the first container based on limiting a flow rate of the working fluid into the first container while pumping the working fluid out of the first container.

5. The system of claim 4, wherein the set of one or more pressure differential control devices includes an outlet valve positioned downstream of the second container on the fluid path and wherein the outlet valve and the pump maintain the second pressure of the second container based on pumping the working fluid into the second container while limiting the flow rate of the working fluid out of the second container.

6. The system of claim 1, wherein the set of one or more pressure differential control devices includes regulator valve upstream of the second container within the thermal management system, wherein the regulator valve limits a flow rate of the working fluid into the second container.

7. The thermal management system of claim 1, wherein the first container is a low pressure container and the second container is a high pressure container, the system further comprising a controller in data communication with the pump and the condenser, the controller configured to cause the thermal management system to:
   detect a change in battery operation of a battery located in the first container;
   change a pressure differential between the first container and the second container based at least partially on the change in battery operation, the second container containing another heat-generating component; and
   lower the boiling temperature of the working fluid proximate the battery.

8. The thermal management system of claim 7, wherein the controller is further configured to cause the thermal management system to add liquid phase working fluid to the first container.

9. The thermal management system of claim 7, wherein the controller is further configured to cause the thermal management system to vent the first container.

10. The thermal management system of claim 7, wherein to change the pressure differential, the controller is configured to cause the thermal management system to increase the condensation rate of the condenser.

11. The thermal management system of claim 7, wherein to change the pressure differential, the controller is configured to cause the thermal management system to precool the working fluid before the first container in a direction of flow of the working fluid.

12. The thermal management system of claim 7, wherein to change the pressure differential, the controller is configured to cause the thermal management system to lower the pressure in the condenser in thermal communication with the working fluid.

13. The thermal management system of claim 7, wherein the change in the battery operation includes a discharge of the battery.

14. The thermal management system of claim 7, wherein the change in battery operation includes charging the battery.

15. The thermal management system of claim 7, wherein:
   to detect the change in battery operation, the controller is configured to cause the thermal management system to detect a future change in battery operation, and
   to change the pressure differential, the controller is configured to cause the thermal management system to change the pressure differential proactively before the future change occurs.

16. The thermal management system of claim 7, wherein the controller is further configured to cause the thermal management system to reduce IT load in the second container.

17. The system of claim 1, wherein the first heat-generating component and the second heat-generating components are each electronic components.

18. The system of claim 1, wherein the first heat-generating component positioned in the first container is a battery and the second heat-generating component positioned in the second container is a computing system component including one or more of a processor, system memory, and a power supply.

19. The system of claim 1, wherein a temperature difference between the first boiling point and the second boiling point is at least 5° C.

20. A thermal management system comprising:
a first container having a first heat-generating component positioned within the first container and having a first portion of a working fluid positioned within the first container at least partially surrounding the first heat-generating component, wherein the first heat-generating component has a first operating temperature, wherein the first operating temperature is based on a first pressure, and wherein the working fluid has a first boiling point at the first operating temperature at the first pressure of the first container;
a second container in fluid communication with the first container having a second heat-generating component positioned within the second container and having a second portion of the working fluid positioned within the second container at least partially surrounding the second heat-generating component, wherein the second heat-generating component has a second operating temperature, wherein the second operating temperature is based on a second pressure, and wherein the second portion of the working fluid has a second boiling point at the second operating temperature at a second pressure of the second container;
a set of one or more pressure differential control devices for maintaining the first portion of the working fluid at the first boiling point by maintaining the first container at the first pressure and for maintaining the second portion of the working fluid at the second boiling point by maintaining the second container at the second pressure, the set of one or more pressure differential control devices operable to move the working fluid through a fluid path of the thermal management system; and
a condenser for condensing a vapor phase of the working fluid into a liquid phase.

* * * * *